United States Patent
Mehandru et al.

(12) 
(10) Patent No.: US 11,276,780 B2
(45) Date of Patent: Mar. 15, 2022

(54) TRANSISTOR CONTACT AREA ENHANCEMENT

(71) Applicant: Intel Corporation, Santa Clara, CA (US)

(72) Inventors: Rishabh Mehandru, Portland, OR (US); Tahir Ghani, Portland, OR (US); Stephen Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 16/024,724

(22) Filed: Jun. 29, 2018

(65) Prior Publication Data

US 2020/0006546 A1 Jan. 2, 2020

(51) Int. Cl.
*H01L 29/78* (2006.01)
*H01L 29/06* (2006.01)
*H01L 29/08* (2006.01)
*H01L 29/10* (2006.01)
(Continued)

(52) U.S. Cl.
CPC ........ *H01L 29/785* (2013.01); *H01L 29/0653* (2013.01); *H01L 29/0847* (2013.01); *H01L 29/105* (2013.01); *H01L 29/41791* (2013.01); *H01L 29/66795* (2013.01); *H01L 2029/7858* (2013.01)

(58) Field of Classification Search
CPC .............. H01L 29/66803; H01L 29/78; H01L 29/0653
See application file for complete search history.

(56) References Cited

U.S. PATENT DOCUMENTS 9,385,140 B1 7/2016 McMullan
2011/0074498 A1* 3/2011 Thompson ...... H01L 21/823807
327/543
(Continued)

FOREIGN PATENT DOCUMENTS

WO WO 2010/045087 4/2010
WO WO 2017/111864 6/2017
WO WO 2018/039645 3/2018

OTHER PUBLICATIONS

Search Report for European Patent Application No. 19176624.5, dated Nov. 7, 2020, 6 pages.

*Primary Examiner* — Changhyun Yi
(74) *Attorney, Agent, or Firm* — Schwabe, Williamson & Wyatt, P.C.

(57) ABSTRACT

A semiconductor device includes a semiconductor body that includes a surface and a first region and a second region formed in the semiconductor body, where a channel region is located between the first region and the second region, and where the second region includes a sub-region that includes a blanket dopant; a first conductive contact on the surface of the semiconductor body above the first region; a semiconductor-on-insulator (SOI) at a bottom of the first region; and a pocket channel dopant (PCD) formed in the channel, where a first portion of the PCD is adjacent to a first portion of the SOI; and a second conductive contact on a bottom portion of the sub-region, where a first portion of the second conductive contact is adjacent to a second portion of the SOI, and a second portion of the second conductive contact is adjacent to a second portion of the PCD.

25 Claims, 8 Drawing Sheets

(51) Int. Cl.
*H01L 29/417* (2006.01)
*H01L 29/66* (2006.01)

(56) References Cited

U.S. PATENT DOCUMENTS

2015/0303061 A1* 10/2015 Choi .................. H01L 29/0878
257/336
2016/0353038 A1    12/2016 Madurawe et al.

* cited by examiner

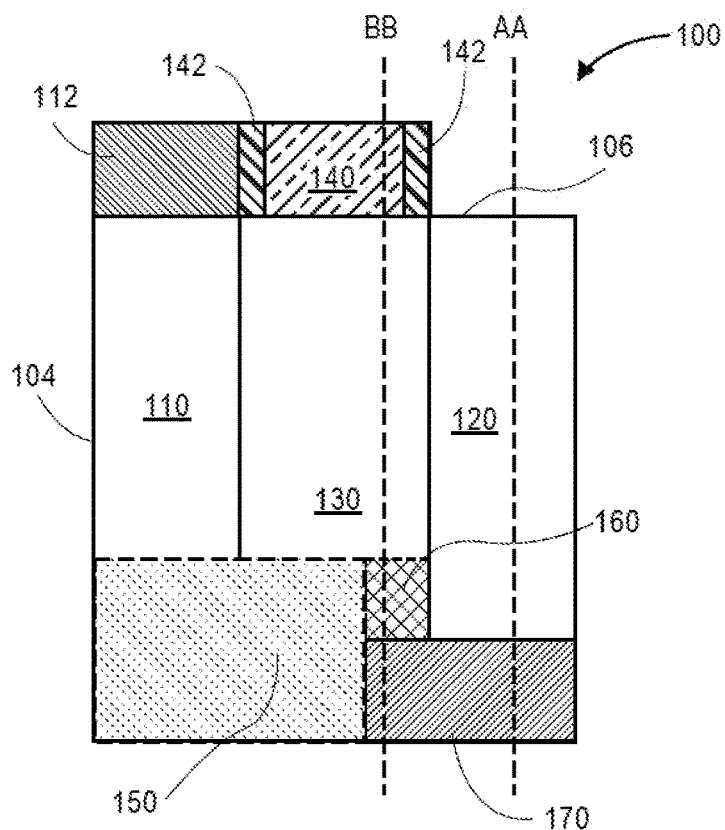
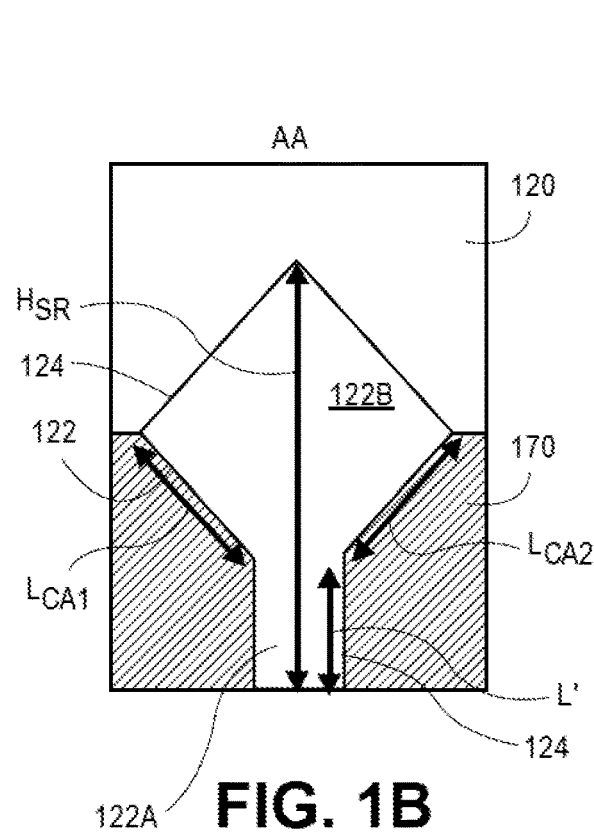 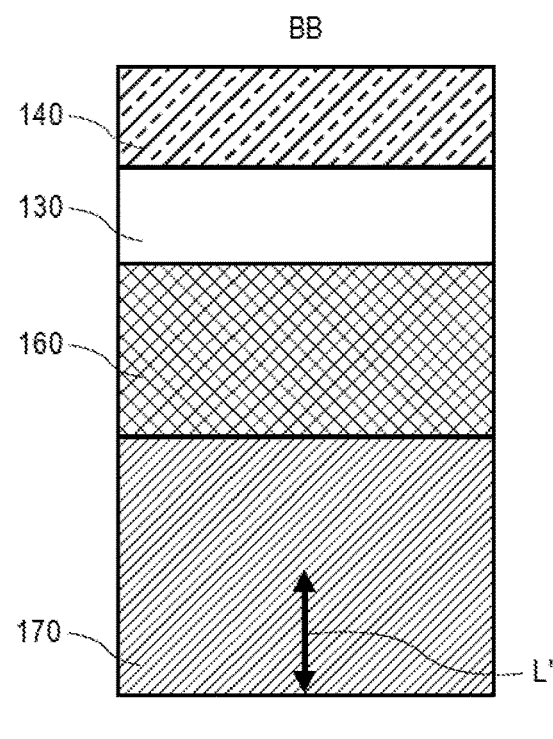
FIG. 1A
FIG. 1B
FIG. 1C

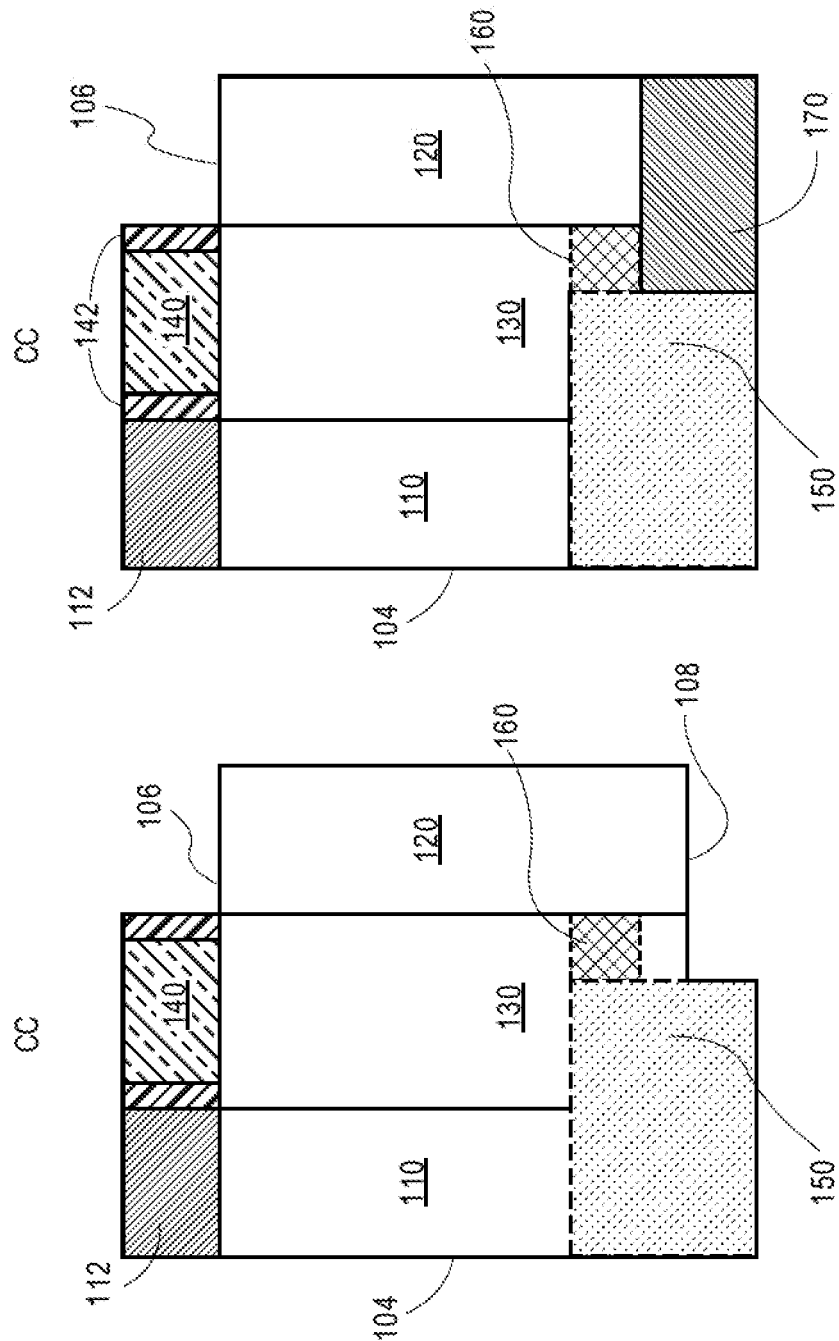

TRANSISTOR CONTACT AREA ENHANCEMENT

TECHNICAL FIELD

Embodiments of the present disclosure relate to the field of semiconductor devices and processing and, in particular, transistor contact area enhancement.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for more capacity, however, is not without issue. The necessity to optimize the performance of each device becomes increasingly significant.

The further reduction in scale of integrated circuit devices has called for the increased usage of non-planar transistors. As device pitches become smaller and smaller, contact area is reduced. As contact area is reduced, contact resistance becomes increasingly important.

BRIEF DESCRIPTION OF THE DRAWINGS

Embodiments will be readily understood by the following detailed description in conjunction with the accompanying drawings. To facilitate this description, like reference numerals designate like structural elements or components. Embodiments are illustrated by way of example and not by way of limitation in the figures of the accompanying drawings.

FIGS. 1A, 1B, and 1C illustrate a semiconductor device, in accordance with various embodiments, where:

FIG. 1A illustrates a front view of the semiconductor device;

FIG. 1B illustrates a cross-sectional view of the semiconductor device taken along the line AA of FIG. 1A; and FIG. 1C illustrates a cross-sectional view of the semiconductor device taken along the line BB of FIG. 1A.

FIGS. 2A, 2B, 2C, 2D, 2E, and 2F illustrate various stages of formation of the semiconductor device depicted in FIG. 1A, in accordance with various embodiments, where:

FIG. 2A illustrates a three-dimensional view of a starting structure for formation of the semiconductor device;

FIG. 2B illustrates a cross-sectional view of the structure of FIG. 2A taken along the line CC of FIG. 2A;

FIG. 2C illustrates the structure of FIG. 2B that includes the line AA';

FIG. 2D illustrates a cross-sectional view of the structure of FIG. 2C taken along the line AA' of FIG. 2C to illustrate sub-region and a blanket dopant;

FIG. 2E illustrates the structure of FIG. 2B that includes a semiconductor-on-insulator (SOI) and a pocket channel dopant (PCD); and FIG. 2F illustrates the structure of FIG. 2E that further a second conductive contact.

DESCRIPTION OF THE EMBODIMENTS

Figure 2A:
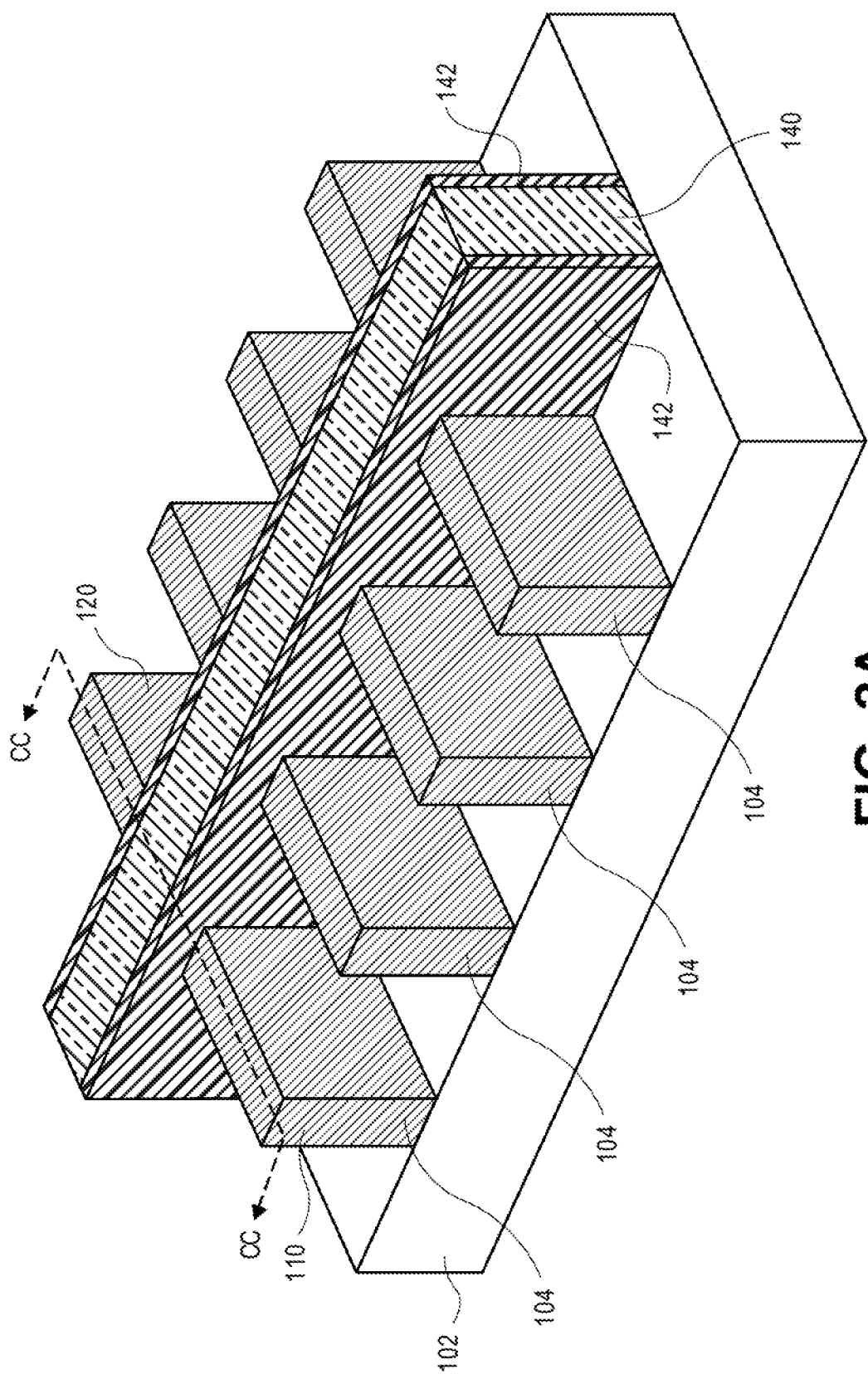

Transistor contact area enhancement is described. The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc., in order to provide a thorough understanding of the various aspects of the claimed embodiments. However, it will be apparent to those skilled in the art having the benefit of the present disclosure that the various aspects of the embodiments claimed may be practiced in other examples that depart from these specific details. In certain instances, descriptions of well-known devices, circuits, integrated circuit design layouts, and methods are omitted or simplified so as not to obscure the description of embodiments of the present disclosure with unnecessary detail. Furthermore, it is to be understood that the various embodiments shown in the Figures are illustrative representations and are not necessarily drawn to scale. For example, the heights, widths, depths, thicknesses, etc. of substrates, layers, regions, etc., may be exaggerated for clarity. Further, it is to be understood that the various embodiments shown in the Figures may include elements that are present but may be hidden from view in a particular Figure or Figures.

Various aspects of the illustrative embodiments may be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations may be set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

The phrase "in an embodiment," "in embodiments," "in various embodiments," "in some embodiments," and the like are used repeatedly. The phrase generally does not refer to the same embodiments; however, it may, and thus may refer to one or more of the same or different embodiments. The terms "comprising," "having," and "including" are synonymous, unless the context dictates otherwise. The phrase "A or B" means (A), (B), or (A and B).

The following description may use certain terminology for the purpose of reference only, and thus are not intended to be limiting. For example, perspective-based descriptions such as "upper", "lower", "above", and "below", and "under" may refer to directions in the drawings to which reference is made. For another example, terms such as "front", "back", "top", "bottom", "rear", and "side" may describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Such descriptions are merely used to facilitate the discussion and are not intended to restrict the application of embodiments described herein to any particular orientation.

The term "coupled with" or "coupled to," along with their derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

It will be understood that when an element, such as, for example, a layer, region, or substrate, is referred to as being "on" another element or surface of another element, it may be directly on the other element or surface of the element, or intervening elements may also be present. Further, it will be understood that when the element is referred to as being "on" another element or surface of another element, it may be "on" the other element or surface of the other element regardless of whether the elements are in a vertical orientation, a horizontal orientation, or an angled orientation. Further, to say that a first element is formed, deposited, or otherwise disposed on or otherwise on, a second element, may mean that the first element is formed, deposited, or disposed over the second element or surface of the second element, and at least a part of the first element may be in direct contact (e.g., direct physical and/or electrical contact) or indirect contact (e.g., having one or more other elements between the first element and the second element) with at least a part of the second element.

Various operations may be described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, example embodiments may be described as a process or operation flow depicted as a flowchart, a flow diagram, a data flow diagram, a structure diagram, or a block diagram. Although a flowchart may describe the operations as a sequential process or operation flow, many of the operations may be performed in parallel, concurrently, or simultaneously. In addition, the order of the operations may be re-arranged. A process or operation flow may be terminated when its operations are completed, but may also have additional operations not included in the figure(s). A process or operation flow may correspond to a method, a function, a procedure, a subroutine, a subprogram, and the like. When a process or operation flow corresponds to a function, its termination may correspond to a return of the function to the calling function and/or the main function.

FIGS. 1A, 1B, and 1C illustrate a semiconductor device, in accordance with various embodiments. FIG. 1A illustrates a front view of semiconductor device 100. Semiconductor device 100 may be, for example, any type of non-planar transistor, such as, for example, but not limited to, a tri-gate transistor, a fin field-effect transistor (FINFET), a tunnel FET (TFET), an omega-FET, a double-gate transistor, or a nanowire. In an embodiment, semiconductor device 100 may be a metal-oxide-semiconductor FET (MOSFET) that may be a three-dimensional MOSFET. Semiconductor device 100 may be an isolated device or may be one device in a plurality of nested devices. Further, additional interconnect wiring may be fabricated in order to integrate such devices into an integrated circuit.

Semiconductor device 100 may include a semiconductor body 104. Semiconductor body 104 may also be referred to as a fin. Semiconductor body 104 may include a first surface 106 and a second surface 108 (not shown in FIG. 1A), where the first surface 106 is opposite the second surface 108. First surface 106 or second surface 108 may be referred to herein as a surface. For example, first surface 106 may be a top surface, and second surface 108 may be a bottom surface that is vertically opposite the top surface, or, for example, first surface 106 may be a bottom surface, and second surface 108 may be a top surface that is vertically opposite the bottom surface, or, for example, first surface 106 may be a first side surface, such as, for example, a left side surface or a right side surface, and second surface 108 may be a second side surface, such as, for example, a right side surface or a left side surface, that is horizontally opposite the first side surface, or first surface 106 may be a first angled surface, and second surface 108 may be a second angled surface that is across from the first angled surface. Further, a top surface of a device or element may be referred to as a front side, while a bottom of a device or element may be referred to as a back side. Semiconductor body 104 may be formed from any material that may be reversibly altered from an insulating state to a conductive state by application of external electrical controls. For example, semiconductor body 104 may be formed from semiconductor material such as, but not limited to, silicon, germanium, silicon germanium, indium antimonide, lead telluride, indium arsenide, indium phosphide, gallium phosphide, gallium arsenide, indium gallium arsenide, gallium antimonide.

Semiconductor device 100 may further include a first region 110 formed in semiconductor body 104 and a second region 120 formed in semiconductor body 104. Thus, semiconductor body 104 may include first region 110 and second region 120 formed in semiconductor body 104. Second region 120 may be located at a side of semiconductor body 104 that is opposite a side of semiconductor body 104 that includes first region 110. For example, as described below and shown in FIG. 1A, first region 110 and second region 120 may be formed in semiconductor body 104 on opposite sides of channel region 130 (described below). In an embodiment, first region 110 may be a drain region and second region 120 may be a source region. In another embodiment, first region 110 may be a source region and second region 120 may be a drain region. In an embodiment, the material of semiconductor body 104 may be removed and replaced with another semiconductor material, e.g., by epitaxial deposition, to form first region 110 and second region 120, where first region 110 and second region 120 may be formed from a material such as, for example, but not limited to, silicon, germanium, silicon germanium, or another group III-V material (described below). In one embodiment, the original material of semiconductor body 104 in first region 110 may be doped to form first region 110, and in second region 120 may be doped to form second region 120.

First region 110 and second region 120 may be formed of the same conductivity type, such as N-type or P-type conductivity. In an embodiment, first region 110 and second region 120 may have a doping concentration of between about $1\times10^{19}$ atoms/cm$^3$ and about $1\times10^{21}$ atoms/cm$^3$. First region 110 and second region 120 may be formed of a uniform concentration or may be sub-regions of different concentrations or doping profiles. For example, semiconductor device 100 may be a symmetrical transistor, in which case first region 110 and second region 120 may include the same doping concentration and profile. Alternatively, semiconductor device 100 may be an asymmetric transistor, in which case the doping concentration and profile of first region 110 and second region 120 may vary in order to obtain a particular electrical characteristic.

Semiconductor device 100 may further include first conductive contact 112 formed on first surface 106 of semiconductor body 104 above first region 110. In an embodiment, first conductive contact 112 may be formed on an exposed surface of semiconductor body 104, where the exposed surface may be on first region 110. In another embodiment, first conductive contact 112 may be formed on an exposed surface of first region 110. An exposed surface on or within first region 110 on which first conductive contact 112 may be formed may be referred to as a first contact area or as a contact area. The first contact area may be where first region 110 may be coupled with first conductive contact 112. In an embodiment, first conductive contact 112 may be deposited onto first surface 106 of semiconductor body 104 with no etching necessary. In another embodiment, first conductive contact 112 may be formed after recess etching semiconductor body 104 above at least a portion of first region 110 and depositing first conductive contact 112 on an exposed surface of first region 110.

Second region 120 may include, as illustrated in FIG. 1B, sub-region 122. Sub-region 122 may include a blanket dopant 124, which may also be referred to as a blanket source-drain dopant. In an embodiment, sub-region 122 may be at the bottom of second region 120. Although embodiments herein may describe sub-region 122 as being at the bottom of second region 120, sub-region 122 may be at the top of or at a side of second region 120 if semiconductor device 100 is at a different orientation than shown in FIG. 1A. In an embodiment, sub-region 122 may be defined by an area that includes area 122A and area 122B, as shown in FIG. 1B, where area 122A may be a sub-fin region and where area 122B may be an epitaxial region. Further, area 122A of sub-region 122 may have a height L', and sub-region 122 may have a height $H_{SR}$. In an embodiment, the height L' of area 122A may be in a range from and including 5 nanometers (nm) to and including 40 nm, measured as shown in FIG. 1B. Further, $H_{SR}$ may be in a range from and including 5 nm to and including 100 nm. If semiconductor device 100 is at a different orientation than depicted in FIG. 1A and FIG. 1B, heights L' and $H_{SR}$ may be measured as if semiconductor device 100 was oriented as shown in FIG. 1A and FIG. 1B. Further, although embodiments herein may describe heights such as L' and $H_{SR}$, other heights described below, such heights may be widths or depths or thicknesses if semiconductor device 100 is at a different orientation than shown in FIG. 1A.

In an embodiment, blanket dopant 124 may be implanted into second region 120 via area 122A of sub-region 122. Although embodiments herein depict blanket dopant 124 in area 122A and area 122B of sub-region 122, blanket dopant 124 may be concentrated in area 122B, or all or substantially all of blanket dopant 124 may be in area 122B. Further, blanket dopant 124 may extend beyond sub-region 122, through, for example, diffusion. For example, blanket dopant 124 may extend into second region 120. Although sub-region 122 is depicted as including a rectangle shape and a diamond shape, sub-region 122 may have any other shape that may result as a function of forming or otherwise processing sub-region 122 or second region 120. For example, sub-region 122 may have a mushroom-like shape or any other shape. Although embodiments herein may include blanket dopant 124 that is adjacent to second conductive contact 170 (described below), embodiments herein may include blanket dopant 124 that may be at least partially within second conductive contact 170.

Blanket dopant 124 may be an implant that may dope second region 120 to eliminate, prevent, alleviate, reduce, or mitigate sub-fin leakage, which may be, for example, current leakage between a source region and a drain region of a transistor in an off-state. In an embodiment, blanket dopant 124 may be phosphorus if, for example, semiconductor device 100 is an NMOS transistor. Although phosphorous is described as blanket dopant 124 for an NMOS transistor, blanket dopant 124 may include material such as, for example, but not limited to, nitrogen, antimony, or any group V material (described below). In another embodiment, the blanket dopant 124 may be boron, if, for example, semiconductor device 100 is a PMOS transistor. Although boron is described as blanket dopant 124 for a PMOS transistor, blanket dopant 124 for a PMOS transistor may include other materials such as, for example, but not limited to, silicon, germanium, aluminum, gallium, indium, scandium, or any group III material (described below). Further, group III and group V materials may be dopants for group IV (described below) substrates, and group IV materials may be dopants for group III-V (described below) substrates. Blanket dopant 124 may be any material that may eliminate, prevent, alleviate, reduce, or mitigate sub-fin leakage, based at least in part on the type of substrate used to form (as described below) semiconductor device 100 and the type of dopant used to create first region 110 and second region 120.

Blanket dopant 124 may be formed by any suitable deposition or implant process, such as, for example, but not limited to, an epitaxial chemical vapor deposition process or other deposition process, such as, for example, but not limited to, atomic layer deposition (ALD), plasma-enhanced chemical vapor deposition (PECVD), physical vapor deposition (PVD), high-density plasma (HDP)-assisted chemical vapor deposition (CVD), or low-temperature CVD.

A portion of semiconductor body 104 located between first region 110 and second region 120 may define a channel region 130 of semiconductor device 100. Thus, first region 110 may be adjacent to channel region 130 on one side of channel region 130, which may be referred to as a first side of channel region 130, and second region 120 may be adjacent to channel region 130 on another side of channel region 130, which may be referred to as a second side of channel region 130, that is opposite the first side of channel region 130. The first side of channel region 130 may be a left side of channel region 130, and the second side of channel region 130 may be a right side of channel region 130. Alternatively, the first side of channel region 130 may be a right side of channel region 130, and the second side of channel region 130 may be a left side of channel region 130. Although first region 110 and second region 120 are described as being on a left side and a right side of channel region 130 based on the orientation of semiconductor device 100 in FIG. 1A, first region 110 and second region 120 may be above and below each other at opposite sides of channel region 130 if semiconductor device 100 is at a different orientation than depicted in FIG. 1A.

In an embodiment, channel region 130 may be intrinsic or undoped monocrystalline silicon. In another embodiment, channel region 130 may be doped monocrystalline silicon. When channel region 130 is doped, it may be doped to a conductivity level of between about $1 \times 10^{16}$ atoms/$cm^3$ to about 1×10$^{19}$ atoms/cm$^3$. Further, when channel region 130 is doped, it may be doped to the opposite conductivity type of the first region 110 and second region 120. For example, first region 110 and second region 120 may be N-type conductivity, in which case channel region 130 may be doped to be P-type conductivity. As a result, semiconductor device 100 may be formed into a negative-channel MOS (NMOS) transistor. Similarly, for example, first region 110 and second region 120 may be P-type conductivity, in which case channel region 130 may be doped to be N-type conductivity. As a result, semiconductor device 100 may be formed into a positive-channel (PMOS) transistor. Channel region 130 may be uniformly doped. Alternatively, channel region 130 may be doped non-uniformly or with differing concentrations to provide particular electrical and performance characteristics.

Semiconductor device 100 may further include a gate structure 140 formed over channel region 130. Gate structure 140 may be formed over first surface 106 and a pair of sidewalls of the portion of the semiconductor body 104 that is above channel region 130. Accordingly, channel region 130 described above may be defined as an area of semiconductor body 104 surrounded by gate structure 140. Although channel region 130 is between first region 110 and second region 120, first region 110 and second region 120 may extend beneath gate structure 140 to define a channel region 130 that may be smaller than the width of gate structure 140.

Gate structure 140 may include a gate electrode layer (not shown) and a gate dielectric layer (not shown). In an embodiment, the gate electrode layer may be formed from a wide range of suitable metals or metal alloys, including a material such as, for example, but not limited to, a metal nitride, metal carbide, metal silicide, metal aluminide, hafnium, zirconium, titanium, titanium nitride, tantalum, tantalum nitride, aluminum, tungsten, copper, ruthenium, palladium, platinum, cobalt, nickel, or conductive metal oxides. In an embodiment, the gate dielectric layer may be formed from a material such as, but not limited to, hafnium oxide, hafnium oxy-nitride, hafnium silicate, hafnium silicon oxide, lanthanum oxide, lanthanum aluminum oxide, zirconium oxide, zirconium silicate, zirconium silicon oxide, tantalum oxide, titanium oxide, barium strontium titanate, barium titanate, barium titanium oxide, strontium titanate, strontium titanium oxide, barium strontium titanium oxide, yttrium oxide, aluminum oxide, lead scandium tantalum oxide, lead zinc niobate, or a combination thereof.

Gate structure 140 may further include a pair of spacers 142, with one spacer on either side of gate structure 140, where spacers 142 are formed on the sidewalls of gate structure 140. Spacers 142 may be formed from any suitable electrical insulator, dielectric, oxide, or nitride material. For example, spacers 142 may be formed from, but not limited to, silicon dioxide, silicon oxy-nitride, or silicon nitride. Although spacers 142 are depicted as including a single layer, spacers 142 may include more than one layer, to, for example, tailor the electrical properties (e.g., dielectric constant) of spacers 142 or tailor one or more physical dimensions.

Accordingly, first region 110 and second region 120 may be disposed in semiconductor body 104, and first conductive contact 112 may be disposed on first region 110. Further, semiconductor body 104 may include channel region 130 of semiconductor device 100 and may be disposed between first region 110 and second region 120. Gate structure 140 may be disposed on and over semiconductor body 104, and gate spacers 142 may be disposed on either side of gate structure 140. Although the sidewalls of first region 110 and second region 120 are depicted as being relatively straight and vertical, the sidewalls of first region 110 and second region 120 may be faceted or curvilinear or any other shape that may result as a function of the processing of first region 110 and second region 120. Further, first region 110 and second region 120 may extend under respective spacers 142 or under respective spacers 142 and gate structure 140.

Semiconductor device 100 may further include an SOI 150 at the bottom of first region 110. In an embodiment, at least a first portion of SOI 150 may be adjacent to at least a first portion of PCD 160 (described below) and at least a second portion of SOI 150 may be adjacent to at least a first portion of second conductive contact 170 (described below). In another embodiment, at least a portion of SOI 150 may be adjacent to at least a portion of PCD 170 and at least a portion of second conductive contact 170. SOI 150 may be in direct physical contact with PCD 160 and/or second conductive contact 170 or at least a portion of PCD 160 and/or second conductive contact 170, or indirect contact with PCD 160 and/or second conductive contact 170 or at least a portion of PCD 160 and/or second conductive contact 170 (e.g., having one or more other elements between SOI 150 and second conductive contact 170) or not in contact with PCD 160 or second conductive contact 170. Although embodiments herein may describe SOI 150 as being at the bottom of first region 110, SOI 150 may be at the top of or at a side of first region 110 if semiconductor device 100 is at a different orientation than shown in FIG. 1A. In an embodiment, at least a portion of SOI 150 may extend into channel region 130, provided that semiconductor device 100 is able to operate as intended, for example, have the current flow described below, when semiconductor device 100 is an "on" state. In another embodiment, SOI 150 may extend into channel region 130 and into second region 120, provided that semiconductor device 100 is able to operate as intended, for example, have the current flow described below, when semiconductor device 100 is an "on" state. In an embodiment, SOI 150 may be inside first region 110. In another embodiment, SOI 150 may include a portion that is inside semiconductor body 104 and a portion that is outside of semiconductor body 104.

In an embodiment, SOI 150 may have a height between 2 nm and 115 nm, such as, for example, between 2 nm and 3 nm. Further, SOI 150 may have a height that is at least as equal to or that is at least approximately or substantially equal to the height of second conductive contact 170. SOI 150 may have a uniform height, or SOI 150 may have varying height, in that, for example, SOI 150 may have a certain height at a portion adjacent to conductive contact 170 and a different height or heights at a portion or portions that are not adjacent to conductive contact 170. Thus, all or part of SOI 150 may be formed to a height that is at least equal to, at least approximately equal to, or at least substantially equal to the height of second conductive contact 170.

SOI 150 may be composed of a semiconductor material suitable for semiconductor device fabrication and an insulation material. The semiconductor material may be formed from a material such as, for example, but not limited to, a lower bulk substrate composed of a single crystal of a material which may include, but is not limited to, silicon, germanium, silicon-germanium or a group III-V (defined below) compound semiconductor material. The insulation material may be formed from a material that may include, for example, but is not limited to, silicon dioxide, silicon nitride or silicon oxy-nitride disposed on the semiconductor material.

Semiconductor device 110 may further include PCD 160 formed in channel 130. FIG. 1A and FIG. 1C illustrate PCD 160. PCD 160 may be a doped region formed in channel region 130. In an embodiment, PCD 160 may be implanted into channel 130 via an area that has the height L' described previously in connection with sub-region 122. PCD 160 may have a height between 5 nm and 100 nm.

Although semiconductor device 100 is described as including both SOI 150 and PCD 160, embodiments herein may include a semiconductor device 100 that includes one or the other. For example, in an embodiment, semiconductor device 100 may include an SOI 150 but not a PCD 160. Further, for example, in another embodiment, semiconductor device 100 may include a PCD 160 but not an SOI 150. Further, the combination of both SOI 150 and PCD 160, or SOI 150 by itself, or PCD 160 by itself may be referred to as a leakage barrier.

In an embodiment, at least a first portion of PCD 160 may be adjacent to at least a first portion of SOI 150, if semiconductor device 100 includes both SOI 150 and PCD 160. In another embodiment, at least a portion of PCD 160 may be adjacent to at least a portion of SOI 150, if semiconductor device 100 includes both SOI 150 and PCD 160. PCD 160 may be in direct physical contact with the first portion of or at least a portion of SOI 150 or indirect contact with the first portion of or at least a portion of SOI 150 (e.g., having one or more other elements between PCD 160 and SOI 150) or not in contact with SOI 150. PCD 160 may be formed within channel region 130. However, PCD 130 may extend into second region 120 and be formed at a junction between channel region 130 and second region 120. Further, PCD 160 may extend into first region 110, and may be formed at a junction between channel region 130 and first region 110.

In an embodiment, at least a second portion of PCD 160 may be adjacent to at least a second portion of second conductive contact 170 (described below). In another embodiment, at least a portion of PCD 160 may be adjacent to at least a portion of second conductive contact 170. In an embodiment, PCD 160 may be above second conductive contact 170. Although embodiments herein may describe PCD 160 as being above second conductive contact 170, PCD 160 may be below second conductive contact 170 or to the side of second conductive contact 170 if semiconductor device 100 is at a different orientation than shown in FIG. 1A. PCD 160 may be in direct physical contact with second conductive contact 170 or indirect contact with second conductive contact 170 (e.g., having one or more other elements between PCD 160 and second conductive contact 170) or not in contact with second conductive contact 170. Although embodiments herein may include PCD 160 that is adjacent to second conductive contact 170, embodiments herein may include PCD 160 that is at least partially within second conductive contact 170. PCD 160 may be of the same conductivity as channel region 130, but of a higher concentration, than the doping of channel region 130. PCD 160 may be formed by ion-implanting dopants beneath gate structure 140 by using, for example, tilted ion-implantation or titled dopant-implantation techniques, or, for example, angled ion-implantation or angled dopant-implantation techniques.

PCD 160 may be phosphorus or boron. PCD 160 may be any material that may eliminate, prevent, alleviate, reduce, or mitigate sub-fin leakage, which is described above, based at least in part on the type of substrate used to form (as described below) semiconductor device 100 and the type of dopant used to create first region 110 and second region 120. For example, if semiconductor device 100 includes a source region and a drain region that are N-type conductivity, the PCD 160 may be phosphorus. Although phosphorous is described as blanket dopant 124 for an NMOS transistor, blanket dopant 124 may include material such as, for example, but not limited to, nitrogen, antimony, or any group V material (described below). Further, for example, if semiconductor device 100 includes a source region and a drain region that are P-type conductivity, the PCD 160 may be boron. Although boron is described as blanket dopant 124 for a PMOS transistor, blanket dopant 124 for a PMOS transistor may include other materials such as, for example, but not limited to, silicon, germanium, aluminum, gallium, indium, scandium, or any group III material (described below).

Semiconductor device 100 may further include second conductive contact 170 formed on a bottom portion of sub-region 122. In an embodiment, second conductive contact 170 may be formed on an exposed surface of the bottom portion of sub-region 122. In another embodiment, second conductive contact 170 may be formed on an exposed surface of second region 120 below sub-region 122. An exposed surface on the bottom portion of sub-region 122 on which second conductive contact 170 may be formed or an exposed surface of second region 120 on which second conductive contact 170 may be formed may be referred to as a second contact area or as a contact area. The second contact area may be where sub-region 122 may be coupled with second conductive contact 170.

In an embodiment, at least a first portion of second conductive contact 170 may be adjacent to at least a second portion of SOI 150, if semiconductor device 100 includes SOI 150. Further, at least a second portion of second conductive contact 170 may be adjacent to at least a second portion of PCD 160, if semiconductor device 100 includes PCD 160. In an embodiment, second conductive contact 170 may be deposited on the bottom portion of sub-region 122 with no etching or polishing necessary. In another embodiment, second conductive contact 170 may be formed, for example, after etching (which may be, for example, but not limited to, a dry etch, a wet etch, or both) or polishing (which may be, for example, be not limited to, a chemical polish, a mechanical polish, or a chemical-mechanical polish (CMP)) semiconductor body 104 or a substrate within at least a portion of second region 120 and depositing second conductive contact 170 on an exposed surface of sub-region 122 or on an exposed surface of second region 120.

In an embodiment, first conductive contact 112 may be a drain contact, and second conductive contact 170 may be source contact. In another embodiment, first conductive contact 112 may be a source contact, and second conductive contact 170 may be a drain contact. First conductive contact 112 and second conductive contact 170 may be formed from a pure metal, such as, for example, but not limited to, titanium, tungsten, nickel, copper, or cobalt or any other suitable metal, or may be an alloy such as, for example, but not limited to, a metal-metal alloy or a metal-semiconductor alloy, such, for example, a silicide that may be formed, for example, by reacting a metal with silicon or silicon germanium. Although first conductive contact 112 is shown on first surface 106 of semiconductor body 104, first conductive contact 112 may be located on second surface 108 of semiconductor body 104. For example, SOI 150 may be etched to create a contact area for deposition of first conductive contact 112.

The contact area for second conductive contact 170 may be enhanced due to the presence of blanket dopant 124, SOI 150, and PCD 160, or any combination thereof, or any one of these elements by itself, in that, for example, the contact area for second conductive contact 170 may be larger than the contact areas of conventional non-planar transistors. Further, for example, the contact area for second conductive contact 170 may be an enhanced contact area in that it may be larger than the contact area for first conductive contact 112, or, for example, the contact area for second conductive contact 170 may be larger than if second conductive contact 170 was formed on first surface 106 above second region 120.

First conductive contact 112, which may be, for example, a drain contact, may be contacted from a front side, and second conductive contact 170, which may be, for example, a source contact, may be contacted from a back side. Blanket dopant 124 may dope sub-region 122, which may be referred to as HSI, which may be, for example, a height of semiconductor body 104 measured from first surface 106, and blanket dopant 124 may be provided on a side of semiconductor body 104 that includes a source region (or a drain region), to eliminate, alleviate, prevent, mitigate, or reduce sub-fin leakage. Accordingly, the contact area for second conductive contact 170 may be increased by using available real estate below HSI on one side, which may be, for example, the source side, of semiconductor device 100. As a result, source side contact resistance, which may be the dominant resistance in "on" state for a transistor, may be alleviated. Although the contact area may be increased by using available real estate below HSI below a source side of semiconductor device 100, the contact area for a contact at a drain side of a semiconductor device 100 may be enhanced to alleviate drain side contact resistance.

Sub-fin leakage, which is described above, may be eliminated, alleviated, prevented, mitigated, or reduced by blanket dopant 124, SOI 150, or PCD 160, or a combination thereof or any one of these elements by itself, though the contact area for second conductive contact 170 may not be as large if semiconductor device 100 includes SOI 150 without PCD 160 or PCD 160 without SOI 150, than if semiconductor device 100 includes both SOI 150 and PCD 160. For example, blanket dopant 124 may enter a sub-fin at a source side of semiconductor device 100. Further, a mask may be used to form SOI 150 at the bottom of or below the side of semiconductor body 104 that includes a drain region, if sub-region 122 is at the bottom of or below a side of semiconductor body 104 that includes a source region (or SOI 150 may be provided at the bottom of or below a side of semiconductor device 100 that includes a source region, if sub-region 122 is at the bottom of or below a side of semiconductor body 104 that includes a drain region), and thus create an SOI at a drain side only, rather than at a source side, or primarily below a drain side (or a source side only, rather than at a drain side, or primarily below a source side, if sub-region 122 is at the bottom of or below a side of semiconductor body 104 that includes a drain region). Further, PCD 160 may be formed by tilted or blanket source (or drain, if sub-region 122 is below a side of semiconductor body 104 that includes a drain region) dopant implants, for example, phosphorus for an NMOS device and boron for a PMOS device. Further, a conductive contact may be formed by contact metal deposition, for example, in the contact area that is an enhanced contact area, which may be, for example, the contact area at a source side, or may be, for example, the contact area at a drain side.

As a result, drain-to-source leakage (or also source-to-drain leakage) below an active fin may be shut off using SOI 150 and/or PCD 160 placement, and the size of the contact area for second conductive contact 170 may be increased or enhanced relative to a non-planar transistor that is not formed in the same manner as semiconductor device 100. For example, depending on the amount of fin real estate on for example, a back side, significant improvement in contact area may be achieved. For example, the contact area for second conductive contact 170 may be doubled for a 25 nm remaining fin on a back side, and if the front side dimension is approximately 50 nm, 25 nm of extra fin on the back side would provide, for example, a 50 nm perimeter increase for the contact area. In an embodiment, if, for example, area 122A of sub-fin region 122 has a height L', as shown in FIG. 1B, total contact area as a result of contact area enhancement may be, for example, $L_{CA}$ equals two times L' (or $L_{CA}=2*L'$), where $L_{CA}$ may be a total length of the contact area for conductive contact 170, which may be the sum of $L_{CA1}$ and $L_{CA2}$ shown in FIG. 1B. Although embodiments may include a total contact area of $L_{CA}$ equals two times L' (or $L_{CA}=2*L'$), embodiments herein may include a total contact area of approximately two times L' (or 2*L'), or may include a total contact area of up to and including two times L' (or 2*L'). Further, although embodiments may include $L_{CA}$ as a sum of $L_{CA1}$ and $L_{CA2}$, embodiments may include $L_{CA}$ as a sum of any portions of sub-region 122 or of the lengths of any portions of sub-region 122 that are in contact with second conductive contact 170 or coupled with second conductive contact 170.

If sub-region 122 was undoped or doped with the same dopants as second region 120, off-state current flow or off-state leakage may occur. Further, based on rough resistance partitioning, this may provide, for example, approximately 25% linear-region drain current (Idlin) gain and approximately 12.5% saturation-region drain current (Idsat) gain, which may be even larger in smaller pitches. Although the contact area for second conductive contact 170 is described as the enhanced contact area, the contact area for first conductive contact 112 may be the enhanced contact area, or both the contact area for first conductive contact 112 and the contact area for second conductive contact 170 may be enhanced contact areas.

In embodiments herein, current flow for semiconductor device 100 may be as follows when gate structure 140 is in an "on" state. A current may flow from second conductive contact 170 to second region 120, across channel region 130, to first region 110, and to first conductive contact 112. Although current flow is described as being from second conductive contact 170 to first conductive contact 112 when gate structure 140 is in the "on" state, embodiments herein may include current flow from first conductive contact 112 to first region 110, across channel region 130, to second region 120, and to second conductive contact 170, when gate structure 140 is in the "on" state.

FIGS. 2A, 2B, 2C, 2D, 2E, and 2F illustrate stages of the formation of a semiconductor device illustrated in FIG. 1A, in accordance with various embodiments. As shown in FIG. 2A, a starting structure for the formation of semiconductor device 100 may include a substrate 102. Substrate 102 may be formed from any suitable material for semiconductor device fabrication. In some embodiments, substrate 102 may be a bulk substrate that may include a group IV semiconductor material (e.g., Si, Ge, SiGe), group III-V semiconductor material, or any other suitable material or materials; an X-on-insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV or group III-V semiconductor material). The use of "group IV semiconductor material" (or "group IV material" or generally, "IV") herein may include at least one group IV element (e.g., silicon, germanium, carbon, tin), such as, for example, but not limited to, silicon (Si), germanium (Ge), silicon germanium (SiGe), and so forth. The use of "group III-V semiconductor material" (or "group III-V material" or generally, "III-V") herein may include at least one group III element (e.g., aluminum, gallium, indium) and at least one group V element (e.g., nitrogen, phosphorus, arsenic, antimony, bismuth), for example, but not limited to, gallium arsenide (GaAs), indium gallium arsenide (InGaAs), indium aluminum arsenide (InAlAs), gallium phosphide (GaP), gallium antimonide (GaSb), indium phosphide (InP), and so forth. The use of "group V semiconductor material" (or "group V material" or generally, "V") herein may include at least one group V element, such as, for example, but not limited to, nitrogen, phosphorus, arsenic, antimony, bismuth, and so forth.

For example, substrate 102 may be formed from, for example, a crystalline substrate formed using silicon, or, for example, substrate 102 may be formed using a material such as, for example, but not limited to, germanium, silicon germanium, indium antimonide, lead telluride, indium arsenide, indium phosphide, gallium phosphide, gallium arsenide, indium gallium arsenide, gallium antimonide, or other combinations of group III-V compound semiconductor materials. Although a few examples of materials from which substrate 102 may be formed are described here, any material that may serve as a foundation upon which a semiconductor device may be built may be used.

As further shown in FIG. 2A, substrate 102 may include one or more semiconductor bodies 104 formed on substrate 102. Although FIG. 2A shows four semiconductor bodies 104, embodiments herein are not limited to a semiconductor device 100 that includes four semiconductor bodies 104. Semiconductor device 100 may include any number of semiconductor bodies 104, whether one semiconductor body 104 or more than one semiconductor body 104. In an embodiment, semiconductor body 104 may be formed from the same material as substrate 102. In another embodiment, semiconductor body 104 may be formed from material that is different than the material used to form substrate 102.

Figure 2B:
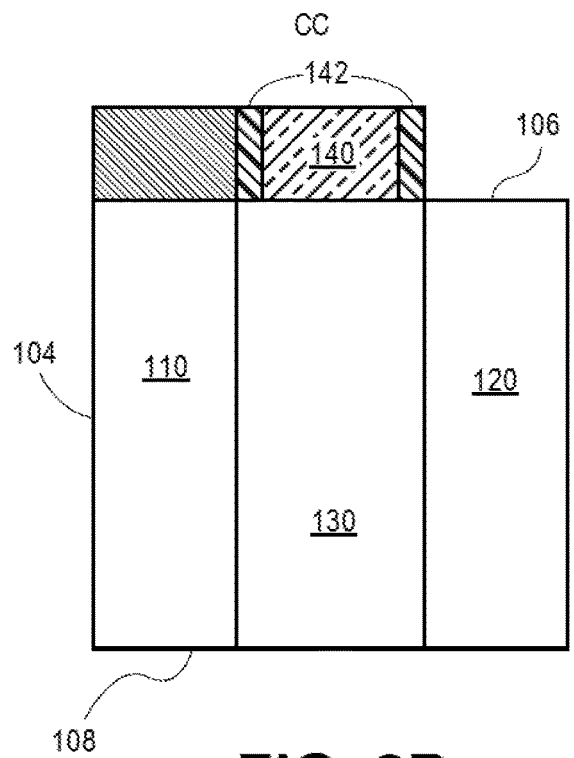

As shown in FIG. 2A and FIG. 2B, semiconductor device 100 may further include first region 110, first conductive contact 112, second region 120, channel region 130, gate structure 140, and spacers 142. Semiconductor body 104, first region 110, first conductive contact 112, second region 120, channel region 130, gate structure 140, and spacers 142 are described above in connection with FIG. 1A. As shown in connection with FIGS. 2B-2F, substrate 102 may be removed during the formation of semiconductor device 100. Substrate 102 may be removed by any technique, such as, for example, but not limited to, a grind process, a polish process, a wet etch process, a dry etch process, or a cleaving process. Although embodiments herein may include a semiconductor device 100 that does not include a substrate 102, embodiments herein may include a semiconductor device 100 that may include at least a portion of a substrate 102.

Figure 2C:
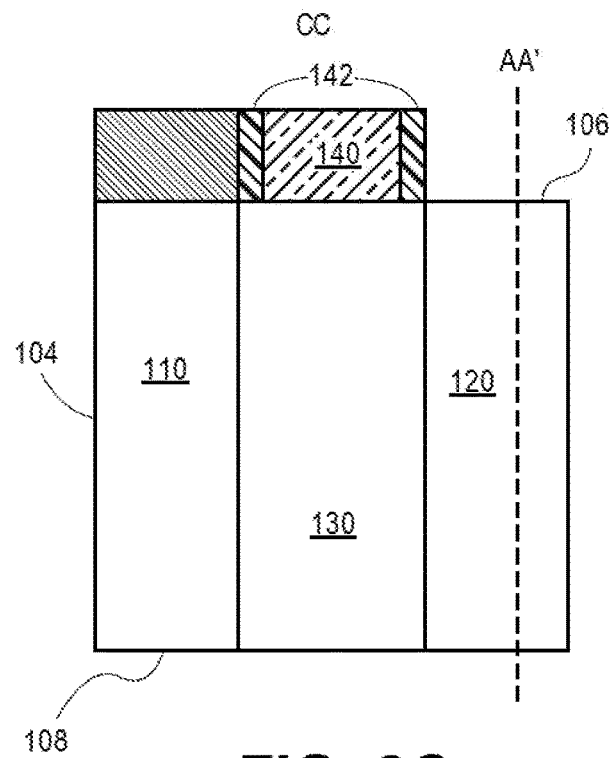
Figure 2D:
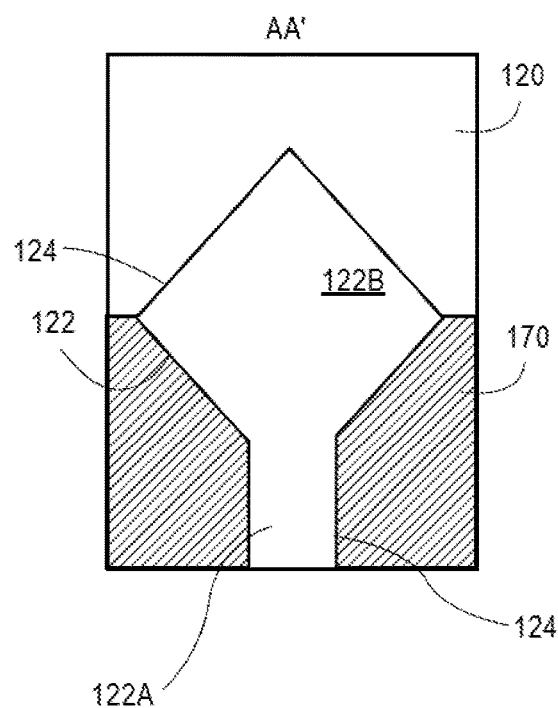

As shown in FIG. 2C and FIG. 2D, semiconductor device 100 may further include the structure of FIG. 2B that may include sub-region 122 and blanket dopant 124. Sub-region 122 and blanket dopant 124 are described above in connection with FIG. 1A and FIG. 1B.

As shown in FIG. 2E, semiconductor device 100 may further include the structure of FIG. 2C that may include SOI 150 and PCD 160. SOI 150 and PCD 160 are described above in connection with FIGS. 1A and 1C.

As shown in FIG. 2F, semiconductor device 100 may further include the structure of FIG. 2E that may include second conductive contact 170. Second conductive contact 170 is described above in connection with FIG. 1A. Although embodiments herein may include a semiconductor device 100 that does not include second surface 108, embodiments herein may include a semiconductor device 100 that may include at least a portion of a second surface 108.

Figure 3:
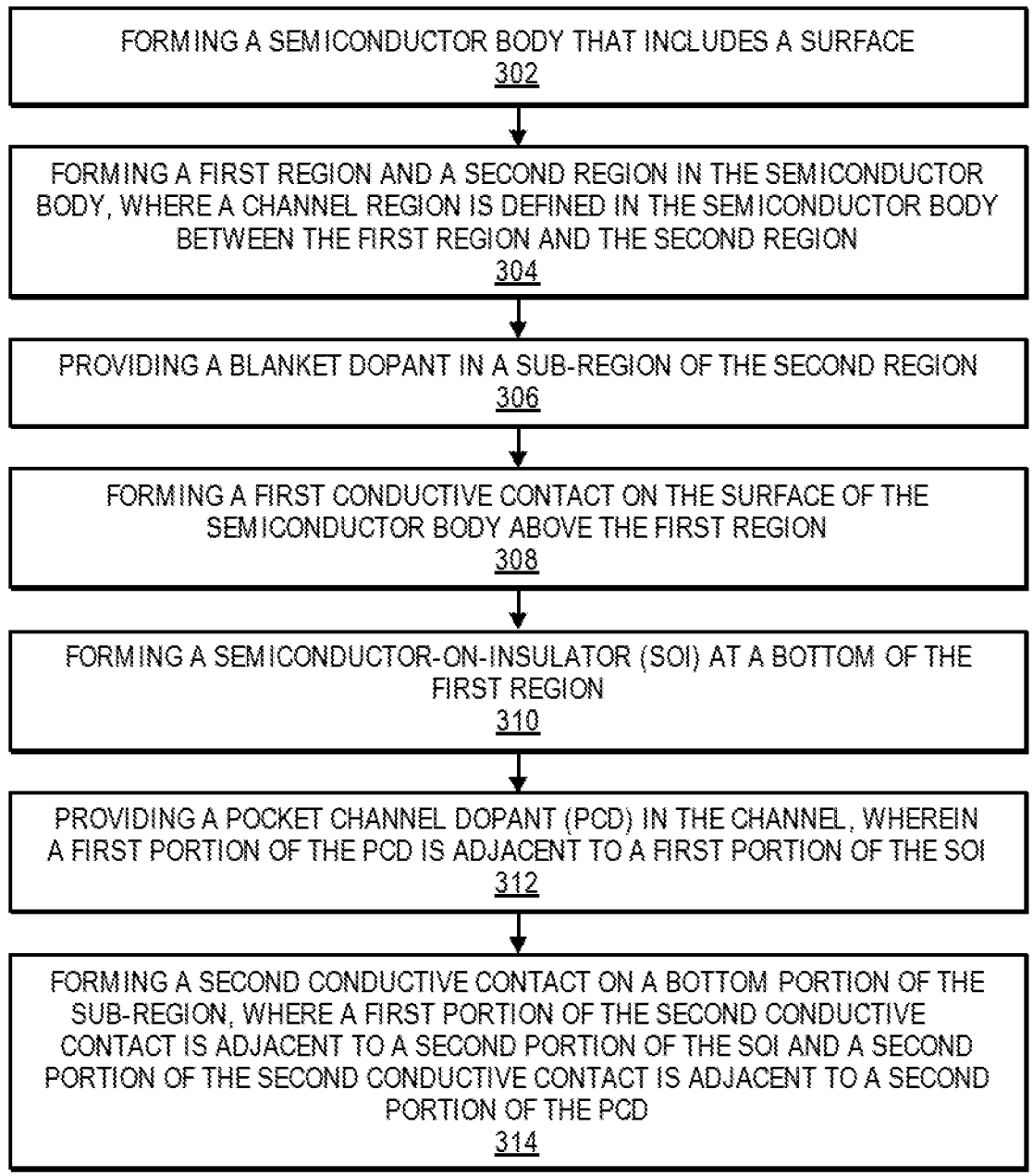
FIG. 3 illustrates an operation flow for forming the semiconductor device illustrated in FIG. 1A.

FIG. 3 illustrates an operation flow for forming the semiconductor device illustrated in FIG. 1A. Operation flow 300 may include, at 302, forming semiconductor body 104 that includes first surface 106. Operation flow 300 may include, at 304, forming first region 110 and second region 120 in semiconductor body 104, where channel region 130 is defined in semiconductor body 104 between first region 110 and second region 120. Operation flow 300 may include, at 306, providing blanket dopant 124 in sub-region 122 of second region 120. Operation flow 300 may include, at 308, forming first conductive contact 112 on first surface 106 above first region 110. In an embodiment, operation flow 300 may further include forming gate structure 140 and spacers 142.

Operation flow 300 may further include, at 310, forming SOI 150 at a bottom of first region 110. Operation flow 300 may further include, at 312, providing PCD 160 in channel region 130, where a first portion of PCD 160 may be adjacent to a first portion of SOI 150. Operation flow 300 may further include, at 314, forming second conductive contact 170 on a bottom portion of sub-region 122, where a first portion of second conductive contact 170 may be adjacent to a second portion of SOI 150 and a second portion of second conductive contact 170 may be adjacent to a second portion of PCD 160.

Figure 4:
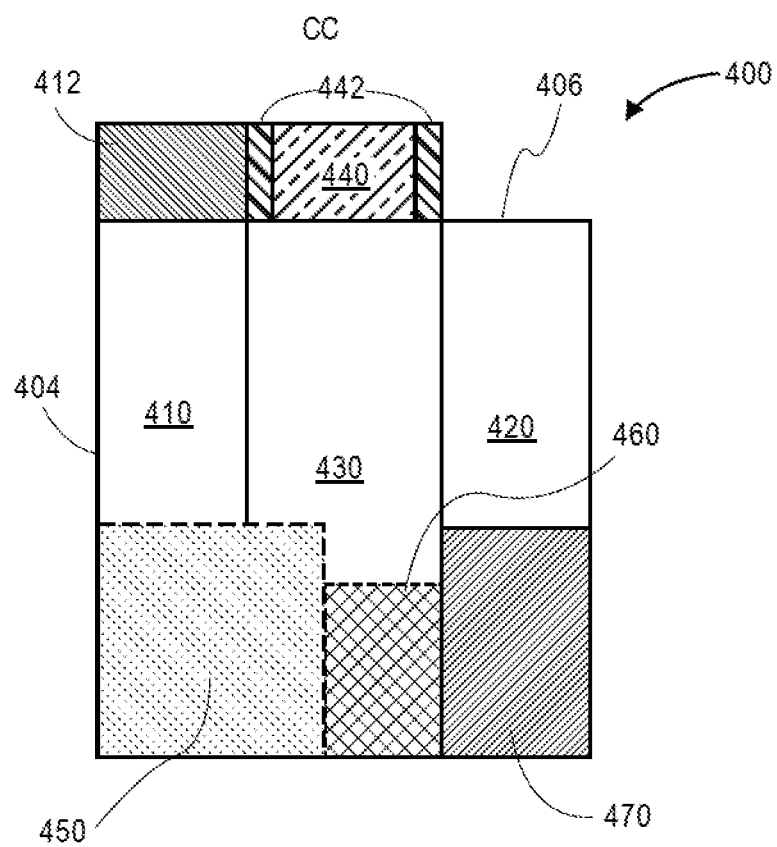
FIG. 4 illustrates a front view of another semiconductor device, in accordance with various embodiments.

FIG. 4 illustrates another semiconductor device, in accordance with various embodiments. Like semiconductor device 100, semiconductor device 400, may be, for example, any type of non-planar transistor, such as, for example, but not limited to, tri-gate transistor, a FINFET, a TFET, an omega-FET, a double-gate transistor, or a nanowire. In an embodiment, like semiconductor device 100, semiconductor device 400 may be a MOSFET that may be a three-dimensional MOSFET. Other than as described in connection with FIG. 4, semiconductor device 400 is the same as semiconductor device 100 described above.

Semiconductor device 400 may include semiconductor body 404. Semiconductor device 400 may include any number of semiconductor bodies 404, whether one semiconductor body 404 or more than one semiconductor body 404. Semiconductor body 404 may include first surface 406, first region 410, first conductive contact 412, second region 420, channel region 430, gate structure 440, and spacers 442. Semiconductor body 404, first surface 406, first region 410, first conductive contact 412, second region 420, channel region 430, gate structure 440, and spacers 442 are the same as corresponding elements semiconductor body 104, first surface 106, first region 110, first conductive contact 112, second region 120, channel region 130, gate structure 140, and spacers 142 described above in connection with FIG. 1A.

Semiconductor device 400 may further include an SOI 450 at a bottom of first region 410, where at least a portion of SOI 450 may be adjacent to at least a portion of PCD 460

(described below). At least a portion of SOI 450 may be in direct physical contact with PCD 460 or indirect contact with at least a portion of second conductive contact 460 (e.g., having one or more other elements between SOI 450 and PCD 460) or not in contact with PCD 460. Other than as described in connection with FIG. 4, SOI 450 is the same as corresponding element SOI 150 described above in connection with FIG. 1A.

Semiconductor device 400 may further include PCD 460. PCD 460 may be a doped region formed in channel region 430. In an embodiment, PCD 460 may be implanted into channel 430 via an area that has the height L' described previously in connection with sub-region 122. Although semiconductor device 400 is described as including both SOI 450 and PCD 460, embodiments herein may include a semiconductor device 400 that includes one or the other. Further, the combination of both SOI 450 and PCD 460, or SOI 450 by itself, or PCD 460 by itself may be referred to as a leakage barrier.

At least a portion of PCD 460 may be adjacent to at least a portion of SOI 450, if semiconductor device 400 includes both SOI 450 and PCD 460. At least a portion of PCD 460 may be in direct physical contact with at least a portion of SOI 450 or indirect contact with at least a portion of SOI 450 (e.g., having one or more other elements between PCD 460 and SOI 450) or not in contact with SOI 450. PCD 460 may be formed within channel region 430. However, PCD 430 may extend into second region 420 and be formed at a junction between channel region 430 and second region 420. Further, PCD 460 may extend into first region 410, and may be formed at a junction between channel region 430 and first region 410.

PCD 460 may be adjacent to SOI 450 at one side of PCD 460, and PCD 460 may be adjacent to second conductive contact 470 (described below) at an opposite side of PCD 460, where at least a portion of PCD 460 may be adjacent to at least a portion of second conductive contact 470. PCD 460 may be in direct contact with at least a portion of SOI 450 or at least a portion of second conductive contact 470 or both, or indirect contact with at least of portion of SOI 450 or at least a portion of second conductive contact 470 or both (e.g., having one or more other elements between SOI 450 or second conductive contact 470 or both) or not in contact with SOI 450 or second conductive contact 470 or both. Although embodiments herein may include PCD 460 that is adjacent to second conductive contact 470, embodiments herein may include PCD 460 that is at least partially within second conductive contact 470. Other than as described in connection with FIG. 4, PCD 460 is the same as corresponding element PCD 160 described above in connection with FIG. 1A.

Semiconductor device 400 may further include a second conductive contact 470 formed on a bottom portion of sub-region 422. In an embodiment, at least a portion of second conductive contact 470 may be adjacent to at least a portion of PCD 460, if semiconductor device 400 includes PCD 460 and SOI 450. In another embodiment, at least a portion of second conductive contact 470 may be adjacent to at least a portion of SOI 450, if semiconductor device 400 includes SOI 450 and not PCD 460. Other than as described in connection with FIG. 4, second conductive contact 470 is the same as corresponding element second conductive contact 170 described above in connection with FIG. 1A.

Figure 5:
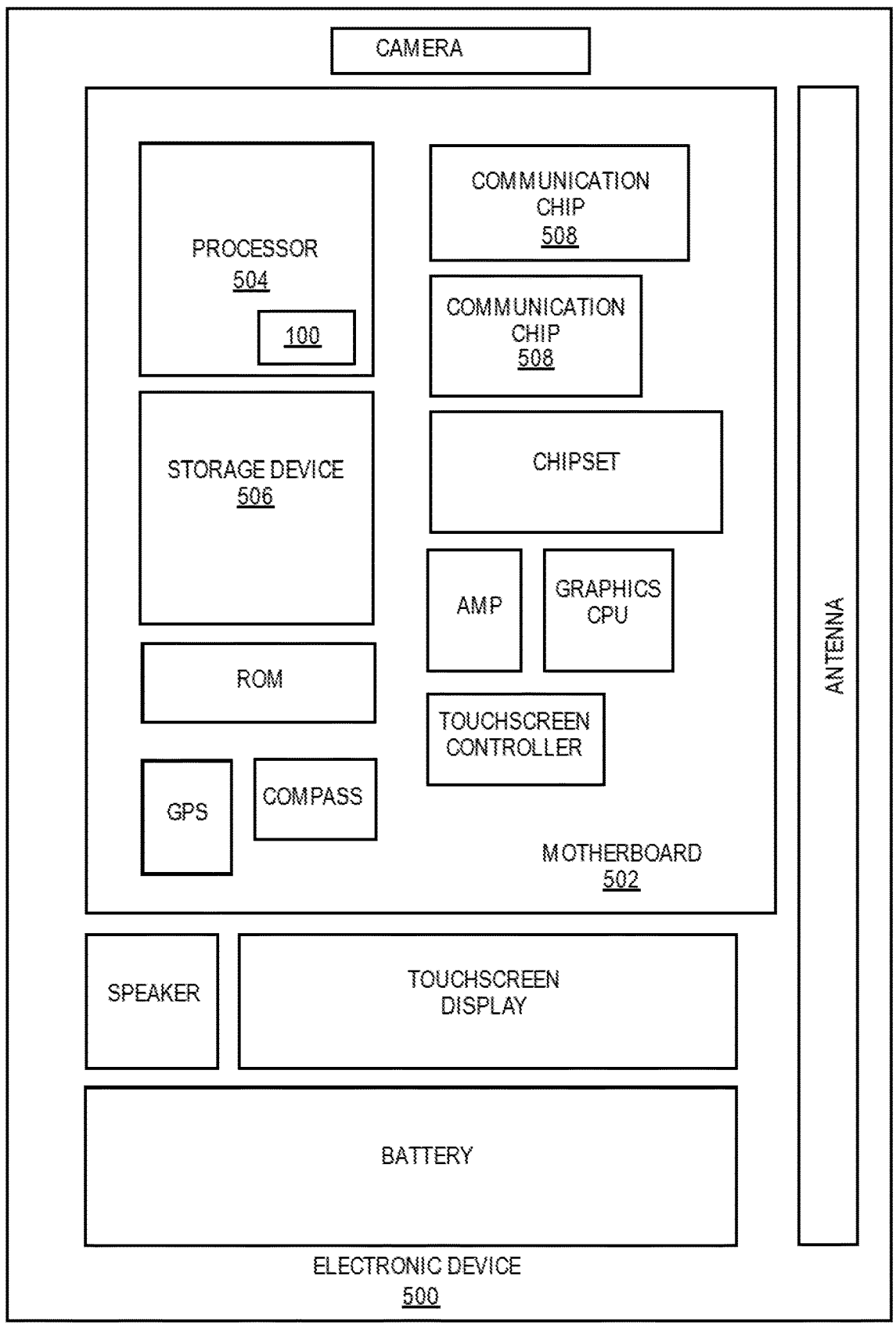
FIG. 5 illustrates an example electronic device that may include a semiconductor device illustrated in FIG. 1A or FIG. 4, in accordance with various embodiments.

FIG. 5 illustrates an example electronic device, in accordance with various embodiments. Electronic device 500 may be, for example, a mobile communication device or a desktop or rack-based electronic device. The electronic device 500 may include a motherboard, such as motherboard 502, which may also be referred to as a board. Board 502 may include a number of components, including, but not limited to, a processor 504, a storage device 506, and at least one communication chip 508.

Depending on its applications, computing system 500 may include one or more other components that may or may not be physically and electrically coupled to the board 502. These other components may include, but are not limited to, a graphics processor, a digital signal processor, a crypto processor, a chipset, an antenna, a display, a touchscreen display, a touchscreen controller, a battery, an audio codec, a video codec, a power amplifier (amp), a global positioning system (GPS) device, a compass, an accelerometer, a gyroscope, a speaker, a camera, and a mass storage device (such as hard disk drive, compact disk (CD), digital versatile disk (DVD), and so forth).

The processor 504 of the electronic device 500 may include one or more devices in accordance with various embodiments described herein, such as semiconductor device 100 or semiconductor device 400 in accordance with various embodiments described herein. The term "processor" may refer to any device or portion of a device that processes electronic data from registers and/or memory to transform that electronic data into other electronic data that may be stored in registers and/or memory.

Figure 6:
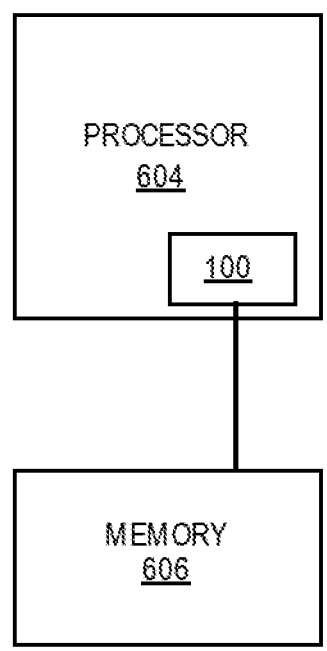
FIG. 6 illustrates a processor that may include various embodiments of the semiconductor device illustrated in FIG. 1A, coupled with a memory.

The electronic device 500 may include a storage device 506. In some embodiments, the storage device 506 may include one or more solid state drives. Examples of storage devices that may be included in the storage device 506 include, but are not limited to, volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth). FIG. 6 illustrates a processor 602 coupled with a memory 604, where processor 602 may include various embodiments of semiconductor device 100. Processor 602 may also include various embodiments of semiconductor device 400.

The communication chip 508 and the antenna may enable wireless communications for the transfer of data to and from the electronic device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 508 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 508 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 508 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 508 may operate in accordance with other wireless protocols in other embodiments.

The electronic device 500 may include a plurality of communication chips 508. For instance, a first communication chip 508 may be dedicated to shorter range wireless communications such as Wi-Fi and Bluetooth, and a second communication chip 508 may be dedicated to longer range wireless communications such as GPS, EDGE, GPRS, CDMA, WiMAX, LTE, EV-DO, and others. In some embodiments, the communication chip 508 may support wired communications. For example, the electronic device 500 may include one or more wired servers.

In various implementations, the electronic device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the electronic device 500 may be any other electronic device that processes data. In some embodiments, the recessed conductive contacts disclosed herein may be implemented in a high-performance electronic device.

Some non-limiting examples are provided below.

EXAMPLES

Example 1 may include a semiconductor device, comprising: a semiconductor body that includes a surface; a first region and a second region formed in the semiconductor body, wherein a channel region is located between the first region and the second region, and wherein the second region includes a sub-region that includes a blanket dopant; a first conductive contact on the surface of the semiconductor body above the first region; a semiconductor-on-insulator (SOI) at a bottom of the first region; a pocket channel dopant (PCD) formed in the channel, wherein the PCD is adjacent to a first portion of the SOI; and a second conductive contact on a bottom portion of the sub-region, wherein a first portion of the second conductive contact is adjacent to a second portion of the SOI, and wherein a second portion of the second conductive contact is adjacent to a second portion of the PCD.

Example 2 may include the semiconductor device of Example 1 or some other example herein, wherein the first region is a source region and the second region is a drain region.

Example 3 may include the semiconductor device of Example 1 or some other example herein, wherein the first region is a drain region and the second region is a source region.

Example 4 may include the semiconductor device of Example 1, 2, or 3, or some other example herein, wherein the blanket dopant is phosphorus.

Example 5 may include the semiconductor device of Example 1, 2, or 3, or some other example herein, wherein the blanket dopant is boron.

Example 6 may include the semiconductor device of Example 1, 2, or 3, or some other example herein, wherein the blanket dopant has a height between 5 nanometers (nm) and 100 nm.

Example 7 may include the semiconductor device of Example 1, 2, or 3, or some other example herein, wherein the SOI has a height between 5 nm and 115 nm.

Example 8 may include the semiconductor device of Example 1, 2, or 3, or some other example herein, wherein the PCD is phosphorus.

Example 9 may include the semiconductor device of Example 1, 2, or 3, or some other example herein, wherein the PCD is boron.

Example 10 may include a semiconductor device, comprising: a semiconductor body that includes a surface; a first region and a second region formed in the semiconductor body, wherein a channel region is located between the first region and the second region, and wherein the second region includes a sub-region that includes a blanket dopant; a first conductive contact on the surface of the semiconductor body above the first region; a leakage barrier; and a second conductive contact on a bottom portion of the sub-region, wherein at least a portion of the second conductive contact is adjacent to at least a portion of the leakage barrier.

Example 11 may include the semiconductor device of Example 10 or some other example herein, wherein the first region is a source region and the second region is a drain region.

Example 12 may include the semiconductor device of Example 10, 11, or some other example herein, wherein the blanket dopant is phosphorus or boron.

Example 13 may include the semiconductor device of claim 10, 11, or some other example herein, wherein the leakage barrier is a semiconductor-on-insulator (SOI), wherein the SOI is at a bottom of the first region.

Example 14 may include the semiconductor device of Example 10, 11, or some other example herein, wherein the leakage barrier is a pocket channel dopant (PCD) formed in the channel.

Example 15 may include the semiconductor device of Example 14 or some other example herein, wherein the PCD is phosphorus or boron.

Example 16 may include the semiconductor device of claim 10, 11, or some other example herein, wherein the leakage barrier comprises: an SOI, wherein the SOI is at a bottom the first region; and a PCD formed in the channel, wherein a first portion of the PCD is adjacent to a first portion of the SOI, a second portion of the SOI is adjacent to a first portion of the second conductive contact, and a second portion of the PCD is adjacent to a second portion of the second conductive contact.

Example 17 may include the semiconductor device of Example 16 or some other example herein, wherein the PCD is phosphorus or boron.

Example 18 may include a system, comprising: a memory; and a processor coupled with the memory, wherein the processor includes a semiconductor device comprising: a semiconductor body that includes a surface; a first region and a second region formed in the semiconductor body, wherein a channel region is located between the first region and the second region, and wherein the second region includes a sub-region that includes a blanket dopant; a first conductive contact on the surface of the semiconductor body above the first region; a semiconductor-on-insulator (SOI) at a bottom of the first region; a pocket channel dopant (PCD) formed in the channel, wherein the PCD is adjacent to a first portion of the SOI; and a second conductive contact on a bottom portion of the sub-region, wherein a first portion of the second conductive contact is adjacent to a second portion of the SOI, and wherein a second portion of the second conductive contact is adjacent to a second portion of the PCD.

Example 19 may include the system to Example 18 or some other example herein, wherein the first region is a source region and the second region is a drain region.

Example 20 may include the system to Example 18, 19, or some other example herein, wherein the blanket dopant is phosphorus or boron.

Example 21 may include the system to Example 18, 19, or some other example herein, wherein the PCD is phosphorus or boron.

Example 22 may include a method, comprising: forming a semiconductor body that includes a surface; forming a first region and a second region in the semiconductor body, wherein a channel region is defined in the semiconductor body between the first region and the second region; providing a blanket dopant in a sub-region of the second region; forming a first conductive contact on the surface of the semiconductor body above the first region; forming a semiconductor-on-insulator (SOI) at a bottom of the first region; providing a pocket channel dopant (PCD) in the channel, wherein a first portion of the PCD is adjacent to a first portion of the SOI; and forming a second conductive contact on a bottom portion of the sub-region, wherein a first portion of the second conductive contact is adjacent to a second portion of the SOI and a second portion of the second conductive contact is adjacent to a second portion of the PCD.

Example 23 may include the method to Example 22 or some other example herein, wherein the first region is a source region and the second region is a drain region.

Example 24 may include the method to Example 22, 23, or some other example herein, wherein the blanket dopant is phosphorus or boron.

Example 25 may include the method to Example 22, 23, or some other example herein, wherein the PCD is phosphorus or boron.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a semiconductor body that includes a surface;
   a first region and a second region formed in the semiconductor body, wherein a channel region is located between the first region and the second region, and wherein the second region includes a sub-region that includes a blanket dopant;
   a first conductive contact on the surface of the semiconductor body above the first region;
   a semiconductor-on-insulator (SOI) at a bottom of the first region;
   a pocket channel dopant (PCD) formed in the channel, wherein a first portion of the PCD is adjacent to a first portion of the SOI; and
   a second conductive contact on a bottom portion of the sub-region, wherein a first portion of the second conductive contact is adjacent to a second portion of the SOI, and wherein a second portion of the second conductive contact is adjacent to a second portion of the PCD.

2. The semiconductor device of claim 1, wherein the first region is a source region and the second region is a drain region.

3. The semiconductor device of claim 1, wherein the first region is a drain region and the second region is a source region.

4. The semiconductor device of claim 1, wherein the blanket dopant is phosphorus.

5. The semiconductor device of claim 1, wherein the blanket dopant is boron.

6. The semiconductor device of claim 1, wherein the blanket dopant has a height between 5 nanometers (nm) and 100 nm.

7. The semiconductor device of claim 1, wherein the SOI has a height between 5 nm and 115 nm.

8. The semiconductor device of claim 1, wherein the PCD is phosphorus.

9. The semiconductor device of claim 1, wherein the PCD is boron.

10. A semiconductor device, comprising:
    a semiconductor body that includes a surface;
    a first region and a second region formed in the semiconductor body, wherein a channel region is located between the first region and the second region, and wherein the second region includes a sub-region that includes a blanket dopant;
    a first conductive contact on the surface of the semiconductor body above the first region;
    a leakage barrier; and
    a second conductive contact on a bottom portion of the sub-region, wherein at least a portion of the second conductive contact is adjacent to at least a portion of the leakage barrier.

11. The semiconductor device of claim 10, wherein the first region is a source region and the second region is a drain region.

12. The semiconductor device of claim 10, wherein the blanket dopant is phosphorus or boron.

13. The semiconductor device of claim 10, wherein the leakage barrier is a semiconductor-on-insulator (SOI), wherein the SOI is at a bottom of the first region.

14. The semiconductor device of claim 10, wherein the leakage barrier is a pocket channel dopant (PCD) formed in the channel.

15. The semiconductor device of claim 14, wherein the PCD is phosphorus or boron.

16. The semiconductor device of claim 10, wherein the leakage barrier comprises:
an SOI, wherein the SOI is at a bottom the first region; and
a PCD formed in the channel, wherein a first portion of the PCD is adjacent to a first portion of the SOI, a second portion of the SOI is adjacent to a first portion of the second conductive contact, and a second portion of the PCD is adjacent to a second portion of the second conductive contact.

17. The semiconductor device of claim 16, wherein the PCD is phosphorus or boron.

18. A system, comprising:
a memory; and
a processor coupled with the memory, wherein the processor includes a semiconductor device comprising:
a semiconductor body that includes a surface;
a first region and a second region formed in the semiconductor body, wherein a channel region is located between the first region and the second region, and wherein the second region includes a sub-region that includes a blanket dopant;
a first conductive contact on the surface of the semiconductor body above the first region;
a semiconductor-on-insulator (SOI) at a bottom of the first region;
a pocket channel dopant (PCD) formed in the channel, wherein the PCD is adjacent to a first portion of the SOI; and
a second conductive contact on a bottom portion of the sub-region, wherein a first portion of the second conductive contact is adjacent to a second portion of the SOI, and wherein a second portion of the second conductive contact is adjacent to a second portion of the PCD.

19. The system of claim 18, wherein the first region is a source region and the second region is a drain region.

20. The system of claim 18, wherein the blanket dopant is phosphorus or boron.

21. The system of claim 18, wherein the PCD is phosphorus or boron.

22. A method, comprising:
forming a semiconductor body that includes a surface;
forming a first region and a second region in the semiconductor body, wherein a channel region is defined in the semiconductor body between the first region and the second region;
providing a blanket dopant in a sub-region of the second region;
forming a first conductive contact on the surface of the semiconductor body above the first region;
forming a semiconductor-on-insulator (SOI) at a bottom of the first region;
providing a pocket channel dopant (PCD) in the channel, wherein a first portion of the PCD is adjacent to a first portion of the SOI; and
forming a second conductive contact on a bottom portion of the sub-region, wherein a first portion of the second conductive contact is adjacent to a second portion of the SOI and a second portion of the second conductive contact is adjacent to a second portion of the PCD.

23. The method of claim 22, wherein the first region is a source region and the second region is a drain region.

24. The method of claim 22, wherein the blanket dopant is phosphorus or boron.

25. The method of claim 22, wherein the PCD is phosphorus or boron.

* * * * *